(12) United States Patent
Ishibashi et al.

(10) Patent No.: US 9,761,922 B2
(45) Date of Patent: Sep. 12, 2017

(54) NON-RECIPROCAL CIRCUIT

(71) Applicant: Mitsubishi Electric Corporation, Tokyo (JP)

(72) Inventors: Hidenori Ishibashi, Tokyo (JP); Tetsu Owada, Tokyo (JP); Akihiro Ando, Tokyo (JP); Hironobu Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 49 days.

(21) Appl. No.: 15/024,596

(22) PCT Filed: Oct. 6, 2014

(86) PCT No.: PCT/JP2014/076671
§ 371 (c)(1),
(2) Date: Mar. 24, 2016

(87) PCT Pub. No.: WO2015/053213
PCT Pub. Date: Apr. 16, 2015

(65) Prior Publication Data
US 2016/0211564 A1    Jul. 21, 2016

(30) Foreign Application Priority Data

Oct. 11, 2013  (JP) .................................. 2013-213740

(51) Int. Cl.
*H01P 1/387* (2006.01)
*H01P 1/38* (2006.01)
*H03H 7/00* (2006.01)

(52) U.S. Cl.
CPC ................ *H01P 1/38* (2013.01); *H01P 1/387* (2013.01); *H03H 7/004* (2013.01)

(58) Field of Classification Search
CPC .... H01P 1/36; H01P 1/38; H01P 1/383; H01P 1/387
(Continued)

(56) References Cited

U.S. PATENT DOCUMENTS 5,495,210 A    2/1996 Forterre et al.
5,786,736 A    7/1998 Dejima et al.
(Continued)

FOREIGN PATENT DOCUMENTS

EP    0616490 A1    9/1994
EP    0843375 A1    5/1998
(Continued)

OTHER PUBLICATIONS

International Search Report of PCT/JP2014/076671 dated Dec. 16, 2014.
(Continued)

*Primary Examiner* — Stephen E Jones
(74) *Attorney, Agent, or Firm* — Studebaker & Brackett PC

(57) ABSTRACT

Input/output terminals 6a, 6b and 6c are formed within portions of cutouts 5a, 5b and 5c provided in a ground conductor 5 on the underside of a magnetic material 3; signal conductors 9a, 9b and 9c are formed within portions of cutouts 8a, 8b and 8c provided in a ground conductor 8 on the top surface of a dielectric substrate 7 at the same places as the cutouts 5a, 5b and 5c of the ground conductor; through holes 10a, 10b and 10c electrically connect a center conductor 4 to the input/output terminals 6a, 6b and 6c; metal bumps 11a, 11b and 11c electrically connect the input/output terminals 6a, 6b and 6c to the signal conductors 9a, 9b and 9c facing each other; and metal bumps 16 electrically connect the ground conductor 5 to the ground conductor 8.

18 Claims, 11 Drawing Sheets

(58) Field of Classification Search
USPC .................................................. 333/1.1, 24.2
See application file for complete search history.

(56) References Cited

U.S. PATENT DOCUMENTS

| | | |
|---|---|---|
| 8,234,777 B2 | 8/2012 | Carr et al. |
| 2004/0263278 A1 | 12/2004 | Hino |
| 2014/0320228 A1* | 10/2014 | Orihashi ................. H01P 1/387 |
| | | 333/1.1 |

FOREIGN PATENT DOCUMENTS

| | | |
|---|---|---|
| GB | 2266412 A | 10/1993 |
| JP | H08-125411 A | 5/1996 |
| JP | 2003-023306 A | 1/2003 |
| JP | 2004-336709 A | 11/2004 |
| JP | 2009-290835 A | 12/2009 |

OTHER PUBLICATIONS

The extended European search report issued by the European Patent Office dated May 12, 2017, which corresponds to European Patent Application No. 14852106.5-1927 and is related to U.S. Appl. No. 15/024,596.

* cited by examiner

NON-RECIPROCAL CIRCUIT

TECHNICAL FIELD

The present invention relates to a non-reciprocal circuit such as a circulator or isolator mainly used for communication equipment.

BACKGROUND ART

Generally, a non-reciprocal circuit such as a circulator and isolator has characteristics of transferring a signal in the transmission direction almost without attenuation, and transferring a signal in the reverse direction with large attenuation, and is sometimes used for a transmitting/receiving circuit of communication equipment.

With downsizing of recent communication equipment, a smaller size non-reciprocal circuit is required.

For example, the following Patent Document 1 discloses a non-reciprocal circuit that has trifurcated microstrip lines formed on a magnetic material applied with a bias magnetic field by a permanent magnet.

Here, as for the input/output terminals for inputting or outputting a signal is drawn outside the outer surface of the permanent magnet.

PRIOR ART DOCUMENT

Patent Document

Patent Document: Japanese Patent Laid-Open No. 8-125411 (FIG. 1).

DISCLOSURE OF THE INVENTION

Problems to be Solved by the Invention

With the foregoing configuration, the conventional non-reciprocal circuit has to draw the input/output terminals to the outside of the permanent magnet, which offers a problem of increasing the size its magnetic material.

In addition, the electrical characteristics of the input/output terminals on the magnetic material vary owing to the effect of the bias magnetic field applied by the permanent magnet. Accordingly, long input/output terminals on the magnetic material are easily affected by the setting position of the permanent magnet and the variation in the intensity of the magnetic field, which offers a problem of varying the electrical characteristics of the input/output terminals at mass production.

In addition, to connect the non-reciprocal circuit to a dielectric substrate, it requires wire connection or ribbon connection, which sometimes cannot achieve stable reflection characteristics. In addition, as for the wire connection or ribbon connection, mounting it on the substrate requires a process separate from the reflow mounting, which presents a problem of increasing the mounting cost.

The present invention is implemented to solve the foregoing problems. Therefore it is an object of the present invention to provide a small-sized, low-cost non-reciprocal circuit with stable reflection characteristics.

Means for Solving the Problems

A non-reciprocal circuit in accordance with the present invention comprises: a planar magnetic material; a center conductor formed on a top surface of the magnetic material; a first ground conductor formed on the underside of the magnetic material, and having a plurality of cutouts provided around its periphery; a plurality of input/output terminals formed within portions of the cutouts provided in the first ground conductor on the underside of the magnetic material; a dielectric substrate disposed face to face with the underside of the magnetic material; a second ground conductor formed on a top surface of the dielectric substrate, and having a plurality of cutouts provided in the same places as the cutouts provided in the first ground conductor; a plurality of signal conductors formed within portions of the cutouts provided in the second ground conductor on the top surface of the dielectric substrate; a first connector to electrically connect the center conductor to the plurality of input/output terminals; a second connector to electrically connect the input/output terminals and the signal conductors facing each other among the plurality of input/output terminals and the plurality of signal conductors, and to electrically connect the first ground conductor with the second ground conductor; and a permanent magnet disposed face to face with the top surface of the magnetic material on which the center conductor is formed.

Advantages of the Invention

According to the present invention, it is configured in such a manner that the plurality of input/output terminals are formed within the portions of the cutouts provided in the first ground conductor on the underside of the magnetic material, and the plurality of signal conductors are formed within the portions of the cutouts provided in the second ground conductor on the top surface of the dielectric substrate, that the first connector electrically connects the center conductor with the plurality of input/output terminals, and the second connector electrically connects the input/output terminals and the signal conductors facing each other, and that the first ground conductor is electrically connected with the second ground conductor. Accordingly, it offers an advantage of being able to achieve stable reflection characteristics, and to implement a small-sized, low-cost non-reciprocal circuit with less variation of the electrical characteristics.

BEST MODE FOR CARRYING OUT THE INVENTION

The best mode for carrying out the invention will now be described with reference to the accompanying drawings to explain the present invention in more detail.

Embodiment 1

Figure 1:
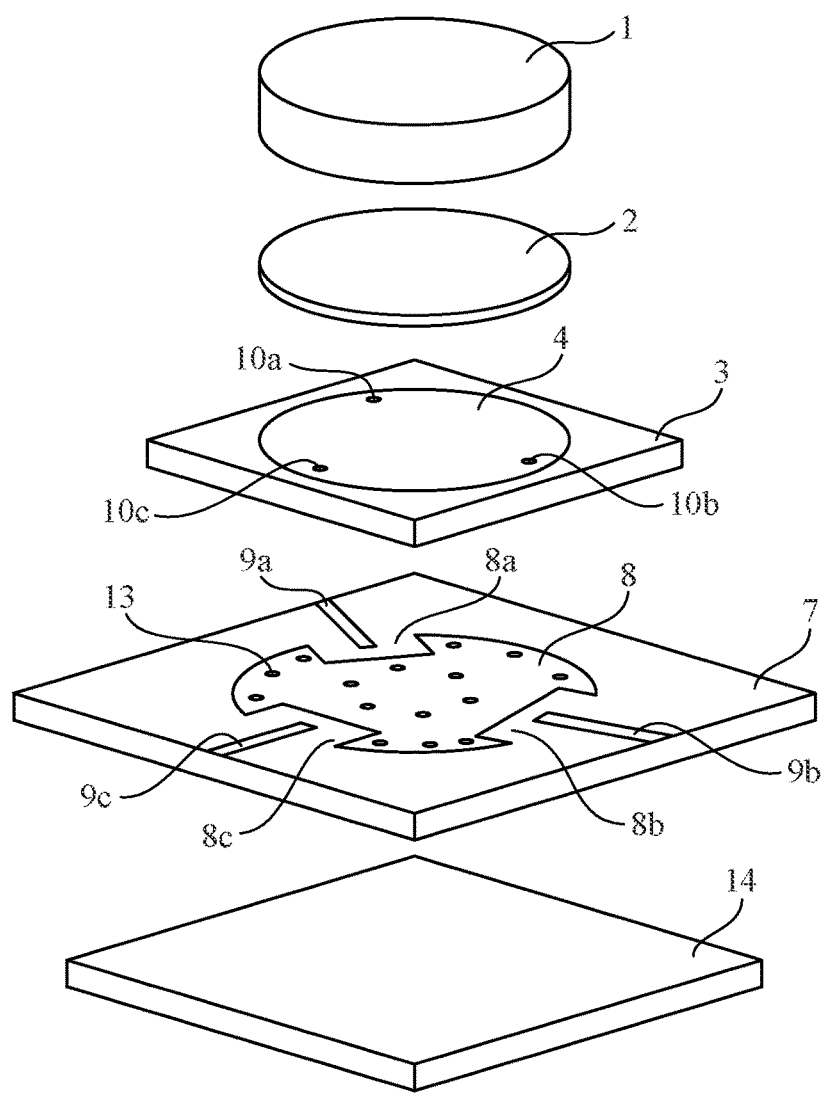
FIG. 1 is an exploded perspective view showing a non-reciprocal circuit of an embodiment 1 in accordance with the present invention.

FIG. 1 is an exploded perspective view showing a non-reciprocal circuit of an embodiment 1 in accordance with the present invention.

Figure 2:
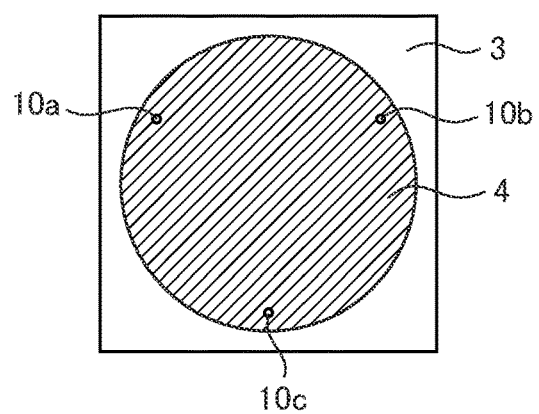
FIG. 2 is a top view showing the magnetic material 3 in the non-reciprocal circuit of FIG. 1.
Figure 3:
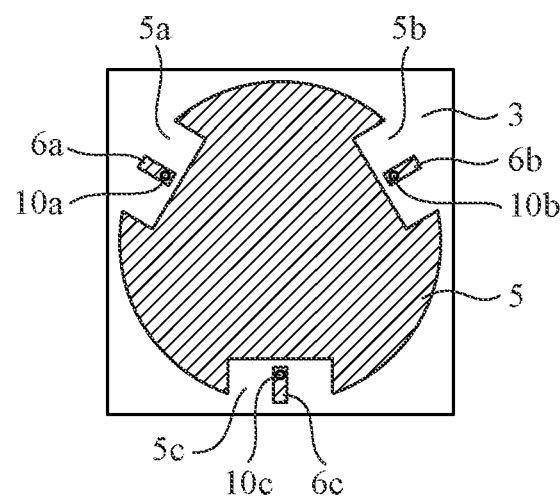
FIG. 3 is a bottom view showing the magnetic material 3 in the non-reciprocal circuit of FIG. 1.

In addition, FIG. 2 is a top view showing the magnetic material 3 in the non-reciprocal circuit of FIG. 1; and FIG. 3 is a bottom view showing the magnetic material 3 of the non-reciprocal circuit of FIG. 1.

Figure 4:
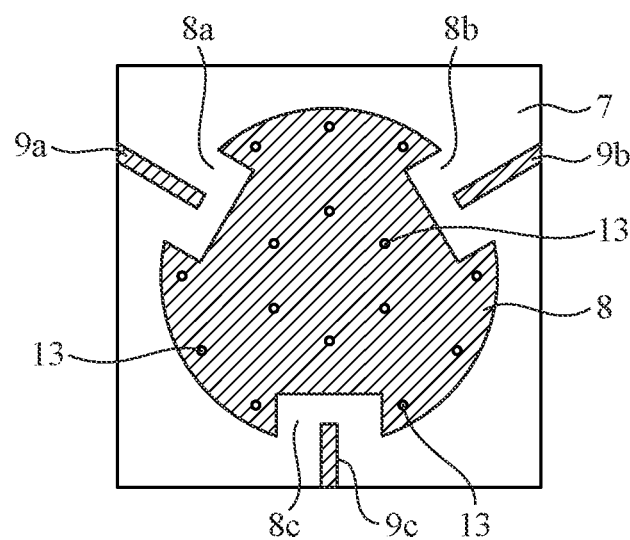
FIG. 4 is a top view showing the dielectric substrate 7 in the non-reciprocal circuit of FIG. 1.
Figure 5:
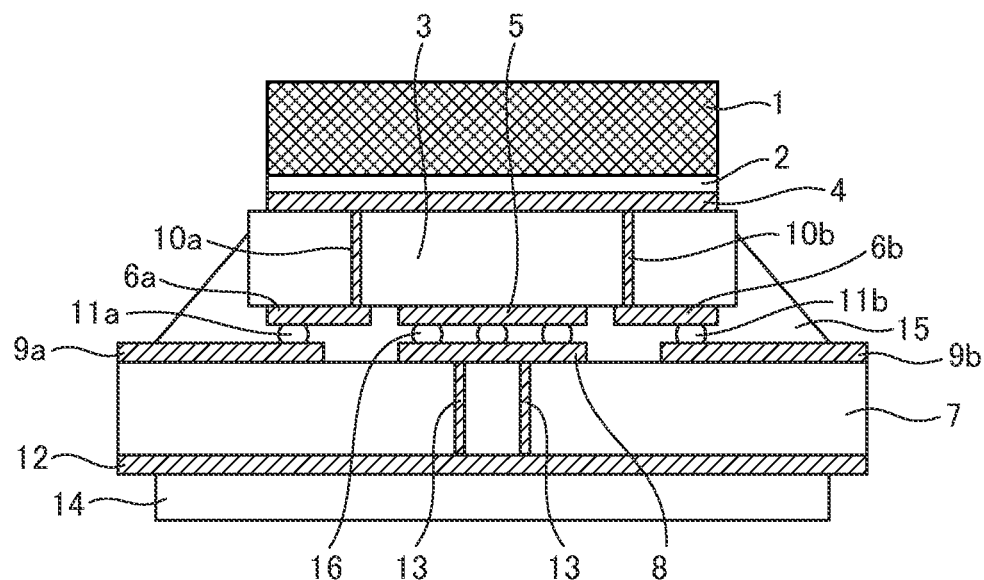
FIG. 5 is a cross-sectional view showing the non-reciprocal circuit of FIG. 1.

In addition, FIG. 4 is a top view showing the dielectric substrate 7 in the non-reciprocal circuit of FIG. 1; and FIG. 5 is a cross-sectional view showing the non-reciprocal circuit of FIG. 1.

In FIG. 1 to FIG. 5, a permanent magnet 1, which is composed for a ferrite magnet, for example, is a component to apply a bias magnetic field to the magnetic material 3.

A spacer 2 is a component to hold a permanent magnet 1 while maintaining the permanent magnet 1 and the magnetic material 3 in a contactless state.

The planar magnetic material 3, which is disposed under the permanent magnet 1 via the spacer 2, is a component on which the bias magnetic field is applied by the permanent magnet 1.

A center conductor 4, which is composed of a metallic conductor, for example, is formed on the top surface of the magnetic material 3.

A ground conductor 5, which is a first ground conductor, is formed on the underside of the magnetic material 3, and has cutouts 5a, 5b and 5c provided around its periphery.

An input/output terminal 6a is formed at a portion within the cutout 5a provided in the ground conductor 5 on the underside of the magnetic material 3.

An input/output terminal 6b is formed at a portion within the cutout 5b provided in the ground conductor 5 on the underside of the magnetic material 3.

An input/output terminal 6c is formed at a portion within the cutout 5c provided in the ground conductor 5 on the underside of the magnetic material 3.

The dielectric substrate 7, which is a substrate made of a dielectric, is disposed under the magnetic material 3.

A ground conductor 8, which is a second ground conductor, is formed on the top surface of the dielectric substrate 7, and is provided with cutouts 8a, 8b and 8c that are formed at the same places with the cutouts 5a, 5b and 5c provided in the ground conductor 5.

A signal conductor 9a is formed at a portion within the cutout 8a provided in the ground conductor 8 on the top surface of the dielectric substrate 7.

A signal conductor 9b is formed at a portion within the cutout 8b provided in the ground conductor 8 on the top surface of the dielectric substrate 7.

A signal conductor 9c is formed at a portion within the cutout 8c provided in the ground conductor 8 on the top surface of the dielectric substrate 7.

A through hole 10a is provided in a manner that it passes through the magnetic material 3 so as to electrically connect the center conductor 4 to the input/output terminal 6a.

A through hole 10b is provided in a manner that it passes through the magnetic material 3 so as to electrically connect the center conductor 4 to the input/output terminal 6b.

A through hole 10c is provided in a manner that it passes through the magnetic material 3 so as to electrically connect the center conductor 4 to the input/output terminal 6c.

Incidentally, the through holes 10a, 10b and 10c constitute a first connector.

A metal bump 11a electrically connects the input/output terminal 6a and the signal conductor 9a facing each other.

A metal bump 11b electrically connects the input/output terminal 6b and the signal conductor 9b facing each other.

A metal bump 11c electrically connects the input/output terminal 6c and the signal conductor 9c facing each other. In FIG. 5, however, the metal bump 11c, input/output terminal 6c and signal conductor 9c are not drawn.

Metal bumps 16 electrically connect the ground conductor 5 and the ground conductor 8.

Incidentally, the metal bumps 11a, 11b and 11c and the metal bumps 16 constitute a second connector.

A ground conductor 12, which is a third ground conductor, is formed on the underside of the dielectric substrate 7.

Through holes 13, which are provided in a manner that they pass through the dielectric substrate 7, electrically connect the ground conductor 8 to the ground conductor 12. Incidentally, the through holes 13 constitute a third connector.

A carrier 14 is a component disposed on the underside of the ground conductor 12.

An insulating material 15 is filled so as to improve the reliability of the connection between the magnetic material 3 and the dielectric substrate 7.

Next, the operation will be described.

The planar magnetic material 3 is disposed under the permanent magnet 1 via the spacer 2 so as to be applied with the bias magnetic field by the permanent magnet 1.

As a result, a signal input via the input/output terminal 6a, 6b or 6c is affected by the bias magnetic field.

More specifically, the signal input to the input/output terminal 6a from the signal conductor 9a is transferred to the input/output terminal 6b almost without attenuation, and is output to the signal conductor 9b. In contrast, a greatly attenuated signal is transferred to the input/output terminal 6c so that the greatly attenuated signal is output from the signal conductor 9c.

Likewise, a signal input to the input/output terminal 6b from the signal conductor 9b is transferred to the input/output terminal 6c almost without attenuation, and is output to the signal conductor 9c. In contrast, a greatly attenuated signal is transferred to the input/output terminal 6a so that the greatly attenuated signal is output from the signal conductor 9a.

In addition, a signal input to the input/output terminal 6c from the signal conductor 9c is transferred to the input/output terminal 6a almost without attenuation, and is output to the signal conductor 9a. In contrast, a greatly attenuated signal is transferred to the input/output terminal 6b so that the greatly attenuated signal is output from the signal conductor 9b.

Thus, the non-reciprocal circuit has characteristics of providing very little attenuation to the signal in the transmission direction, but providing large attenuation to the signal in the reverse direction.

In the present embodiment 1, the input/output terminals 6a, 6b and 6c are formed at the portions within the cutouts 5a, 5b and 5c provided in the ground conductor 5 on the underside of the magnetic material 3, and the signal conductors 9a, 9b and 9c are formed at the portions within the cutouts 8a, 8b and 8c of the ground conductor 8, which cutouts 8a, 8b and 8c are provided on the top surface of the dielectric substrate 7, at the same places as the cutouts 5a, 5b and 5c provided in the ground conductor 5.

In addition, the through holes 10a, 10b and 10c electrically connect the center conductor 4 with the input/output terminals 6a, 6b and 6c, and the metal bumps 11a, 11b and 11c electrically connect the input/output terminals 6a, 6b and 6c and the signal conductors 9a, 9b and 9c facing each other. In FIG. 5, however, the metal bump 11c, input/output terminal 6c and signal conductor 9c are not drawn.

In addition, the metal bumps 16 electrically connect the ground conductor 5 to the ground conductor 8.

Thus, it is not necessary for the present embodiment 1 to pull the input/output terminals out of the outer surface of the permanent magnet as in the conventional non-reciprocal circuit, and it can form the input/output terminals 6a, 6b and 6c inside the outer surface of the permanent magnet 1 (see FIG. 3, for example). Accordingly, it can downsize the magnetic material 3.

In addition, since the length of the input/output terminals on the magnetic material reduces, the present embodiment 1 becomes immune to the effect of the magnet, thereby being able to reduce the variation of the electrical characteristics at mass production.

In addition, since the metal bumps 11a, 11b and 11c provide the electrical connection between the input/output terminals 6a, 6b and 6c and the signal conductors 9a, 9b and 9c, the present embodiment 1 does not require any wire connection or ribbon connection. Accordingly, it can achieve stable reflection characteristics (characteristics with very little reflection).

In addition, when mounting the magnetic material 3 and the like over the dielectric substrate 7, the present embodiment 1 can carry out reflow mounting of them together with other components (chip capacitors and an IC not shown). Thus it can reduce the mounting cost.

As is clear from the above, according to the present embodiment 1, it is configured in such a manner that it has the input/output terminals 6a, 6b and 6c formed within the portions of the cutouts 5a, 5b and 5c provided in the ground conductor 5 on the underside of the magnetic material 3; and has the signal conductors 9a, 9b and 9c formed within the portions of the cutouts 8a, 8b and 8c of the ground conductor 8 on the top surface of the dielectric substrate 7, which cutouts 8a, 8b and 8c are provided at the same places as the cutouts 5a, 5b and 5c provided in the ground conductor 5, wherein the through holes 10a, 10b and 10c electrically connect the center conductor 4 with the input/output terminals 6a, 6b and 6c; the metal bumps 11a, 11b and 11c electrically connect the input/output terminals 6a, 6b and 6c and the signal conductors 9a, 9b and 9c facing each other; and the metal bumps 16 electrically connect the ground conductor 5 with the ground conductor 8. Accordingly, the present embodiment 1 offers an advantage of being able to achieve stable reflection characteristics, and to implement a small-sized, low-cost non-reciprocal circuit with less variation of the electrical characteristics.

Although the present embodiment 1 supposes that the signal conductors 9a, 9b and 9c formed on the top surface of the dielectric substrate 7 are a microstrip line, the signal conductors 9a, 9b and 9c are not limited to a microstrip line. For example, the signal conductors 9a, 9b and 9c can be a transmission line such as a coplanar line and a stripline.

In addition, although the present embodiment 1 shows an example having the insulating material 15 filled between the magnetic material 3 and the dielectric substrate 7 to improve the reliability of the connection between them, the insulating material 15 is not an essential component.

In addition, although the present embodiment 1 shows an example in which the permanent magnet 1 is disposed over the top surface of the magnetic material 3 via the spacer 2, it is enough for the permanent magnet 1 to be able to apply a bias magnetic field perpendicular to the plane of the magnetic material 3. For example, the permanent magnet 1 can be disposed on the underside of the dielectric substrate 7.

Likewise, as for the carrier 14, it can be disposed on the opposite side of the permanent magnet 1 across the magnetic material 3.

Embodiment 2

Figure 6:
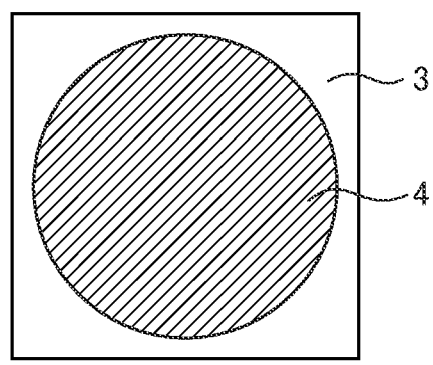
FIG. 6 is a top view showing the magnetic material 3 of a non-reciprocal circuit of an embodiment 2 in accordance with the present invention.
Figure 7:
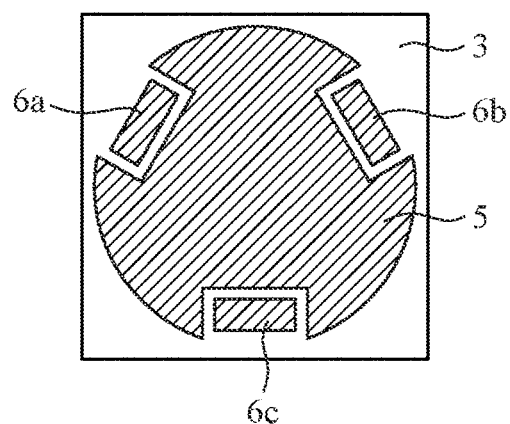
FIG. 7 is a bottom view showing the magnetic material 3 of the non-reciprocal circuit of the embodiment 2 in accordance with the present invention.

FIG. 6 is a top view showing the magnetic material 3 of a non-reciprocal circuit of an embodiment 2 in accordance with the present invention; and FIG. 7 is a bottom view showing the magnetic material 3 of the non-reciprocal circuit of the embodiment 2 in accordance with the present invention.

Figure 8:
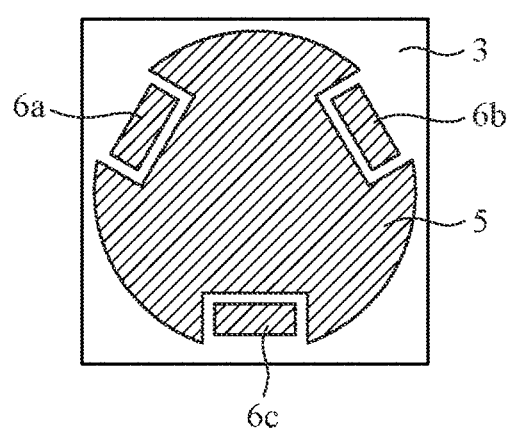
FIG. 8 is a top view showing the dielectric substrate 7 of the non-reciprocal circuit of the embodiment 2 in accordance with the present invention.
Figure 9:
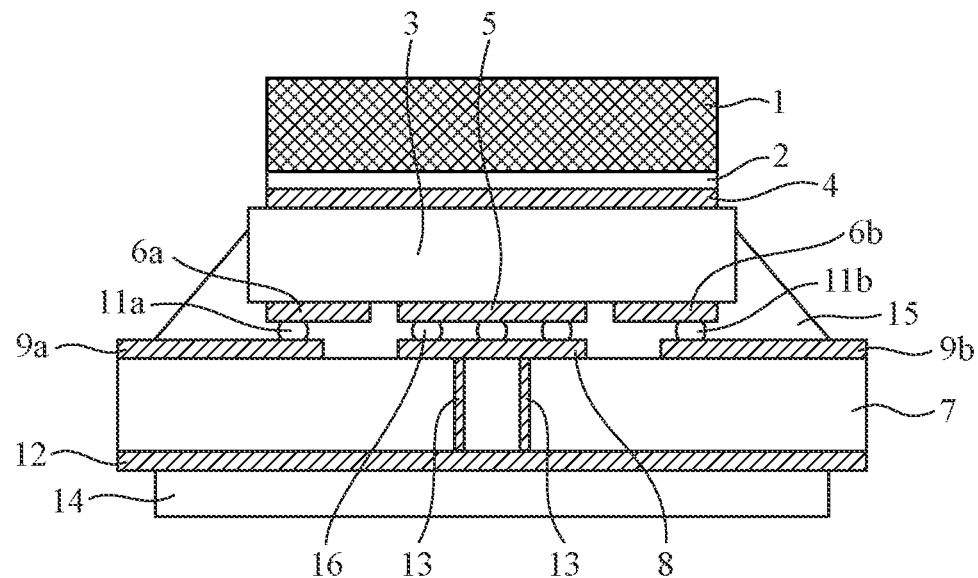
FIG. 9 is a cross-sectional view showing the non-reciprocal circuit of the embodiment 2 in accordance with the present invention.

In addition, FIG. 8 is a top view showing the dielectric substrate 7 of the non-reciprocal circuit of the embodiment 2 in accordance with the present invention; and FIG. 9 is a cross-sectional view showing the non-reciprocal circuit of the embodiment 2 in accordance with the present invention.

In FIG. 6 to FIG. 9, since the same reference symbols as those of FIG. 2 to FIG. 5 designate the same or like components, their description will be omitted.

Although the foregoing embodiment 1 shows an example in which the first connector is comprised of the through holes 10a, 10b and 10c passing through the magnetic material 3, which through holes 10a, 10b and 10c electrically connect the center conductor 4 with the input/output terminals 6a, 6b and 6c, the present embodiment 2 has the capacitive coupling (electrical connection through a capacitor comprised of the center conductor 4 and the input/output terminals 6a, 6b and 6c) electrically connect the center conductor 4 with the input/output terminals 6a, 6b and 6c.

Even though the present embodiment 2 connects the center conductor 4 with the input/output terminals 6a, 6b and 6c electrically through the capacitive coupling, it can not only achieve the same effect and advantages as those of the foregoing embodiment 1, but also reduce the fabricating cost because it can obviate the necessity of forming the through holes 10a, 10b and 10c in the magnetic material 3.

Except that the capacitive coupling electrically connects the center conductor 4 with the input/output terminals 6a, 6b and 6c, the present embodiment 2 is the same as the foregoing embodiment 1. Thus its detailed description will be omitted.

Embodiment 3

Figure 10:
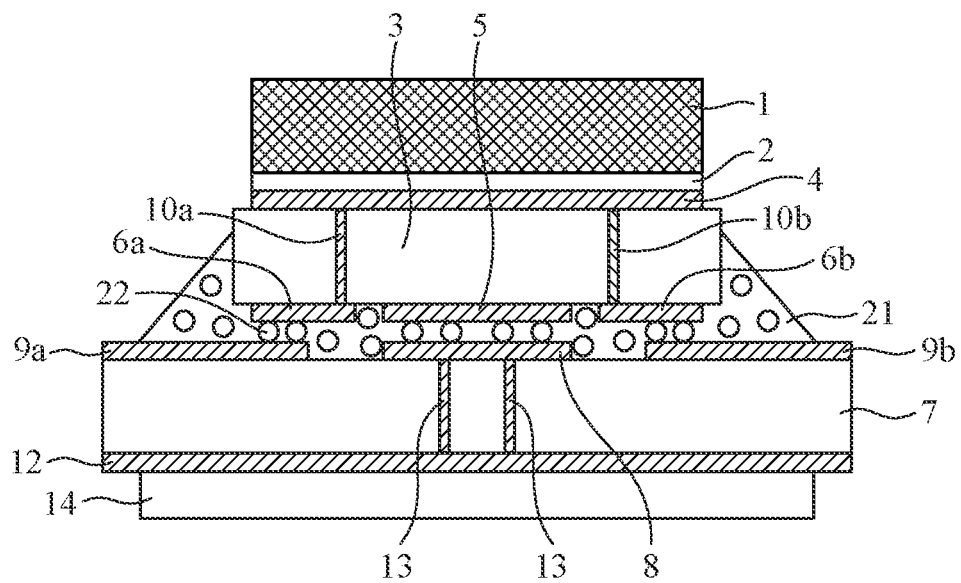
FIG. 10 is a cross-sectional view showing a non-reciprocal circuit of an embodiment 3 in accordance with the present invention.

FIG. 10 is a cross-sectional view showing a non-reciprocal circuit of an embodiment 3 in accordance with the present invention. In FIG. 10, since the same reference symbols as those of FIG. 5 designate the same or like components, their description will be omitted.

An insulating material 21, which has conductive particles 22 dispersed therein, is filled between the magnetic material 3 and the dielectric substrate 7. As the insulating material 21 in which the conductive particles 22 are dispersed, an anisotropic conductive adhesive can be used, for example. Incidentally, the insulating material 21 constitutes a second connector.

Although the foregoing embodiment 1 shows an example in which the second connector is comprised of the metal bumps 11a, 11b and 11c which electrically connect the input/output terminals 6a, 6b and 6c and the signal conductors 9a, 9b and 9c facing each other (in FIG. 5, the metal bump 11c, the input/output terminal 6c and the signal conductor 9c are not drawn), in the present embodiment 3, the insulating material 21 with the conductive particles 22 dispersed therein electrically connects the input/output terminals 6a, 6b and 6c and the signal conductors 9a, 9b and 9c facing each other. In FIG. 10, the input/output terminal 6c and the signal conductor 9c are not drawn.

The present embodiment 3, which electrically connects the input/output terminals 6a, 6b and 6c and the signal conductors 9a, 9b and 9c facing each other through the insulating material 21 with the conductive particles 22 dispersed therein, can achieve the same effect and advantages as the foregoing embodiment 1.

Here, the circuit is shown in which the first connector is comprised of the through holes 10a, 10b and 10c which pass through the magnetic material 3, and electrically connect the center conductor 4 with the input/output terminals 6a, 6b and 6c. However, as in the foregoing embodiment 2, a configuration is also possible which connects the center conductor 4 with the input/output terminals 6a, 6b and 6c electrically through the capacitive coupling.

Figure 11:
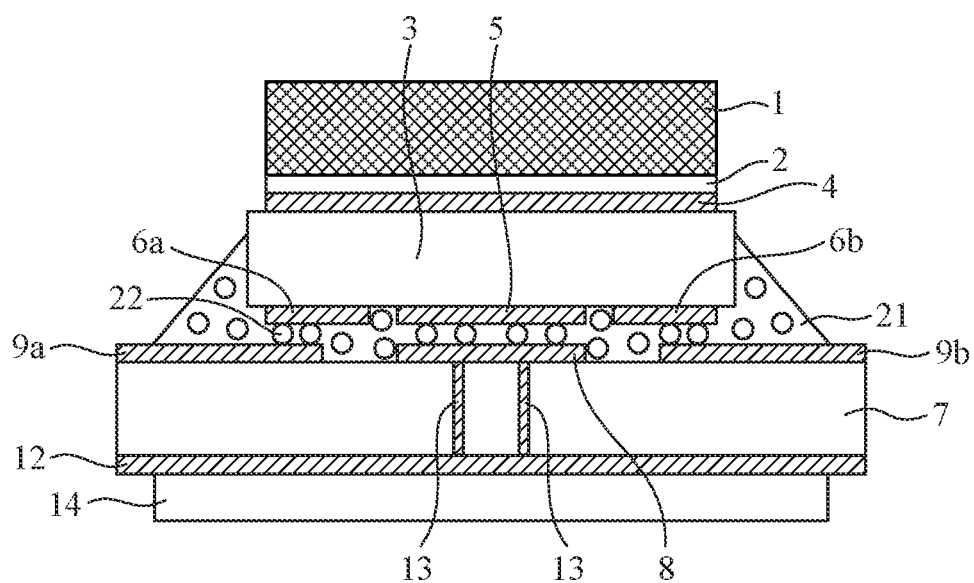
FIG. 11 is a cross-sectional view showing a non-reciprocal circuit having its center conductor 4 connected to its input/output terminals 6a, 6b and 6c through capacitive coupling.

FIG. 11 is a cross-sectional view showing a non-reciprocal circuit which connects the center conductor 4 with the input/output terminals 6a, 6b and 6c through the capacitive coupling.

In this case, since it can obviate the necessity of forming the through holes 10a, 10b and 10c in the magnetic material 3, it can reduce the fabricating cost.

Embodiment 4

Figure 12:
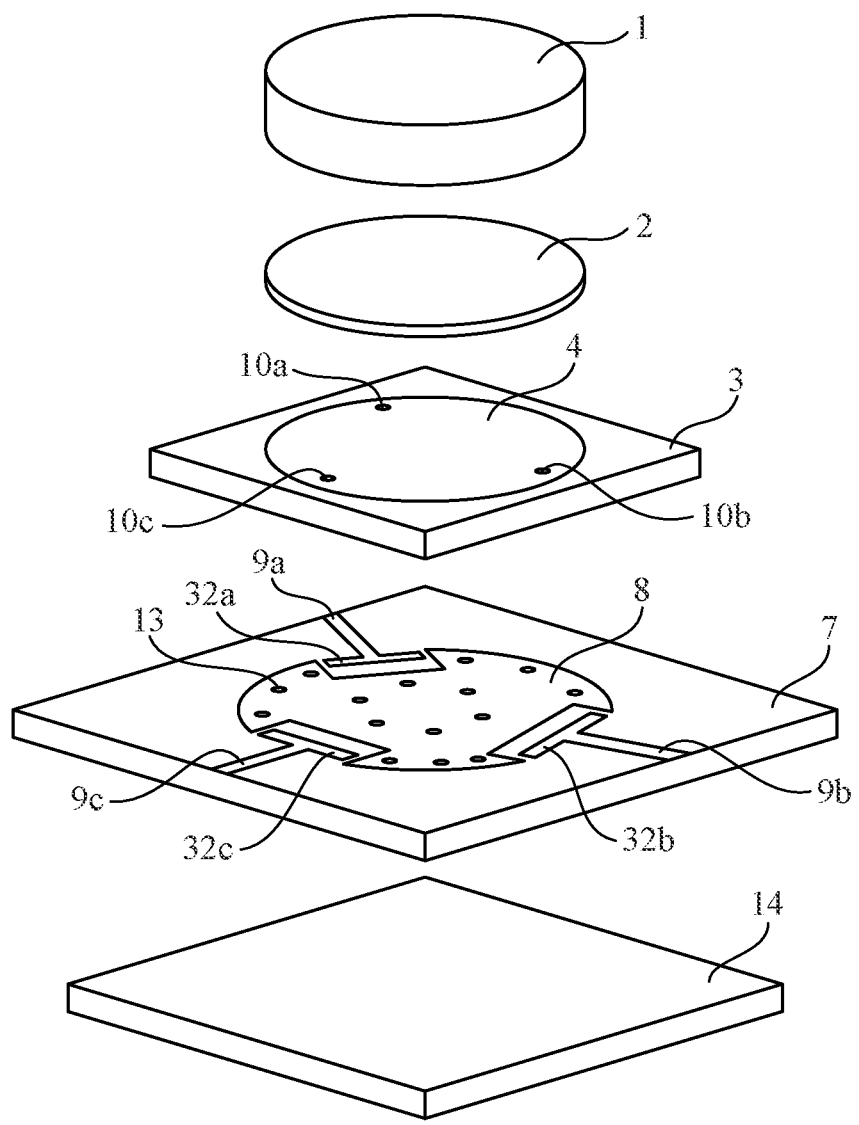
FIG. 12 is an exploded perspective view showing a non-reciprocal circuit of an embodiment 4 in accordance with the present invention.

FIG. 12 is an exploded perspective view showing a non-reciprocal circuit of an embodiment 4 in accordance with the present invention.

Figure 13:
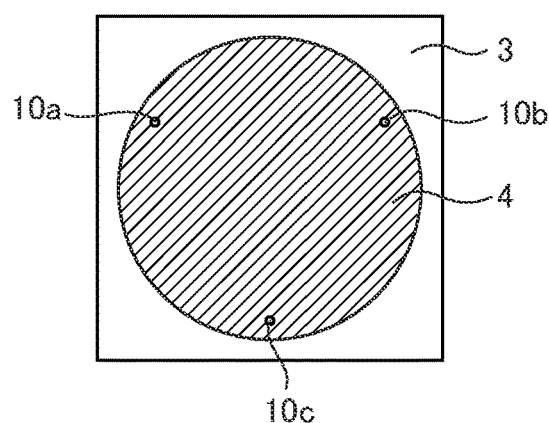
FIG. 13 is a top view showing the magnetic material 3 in the non-reciprocal circuit of FIG. 12.
Figure 14:
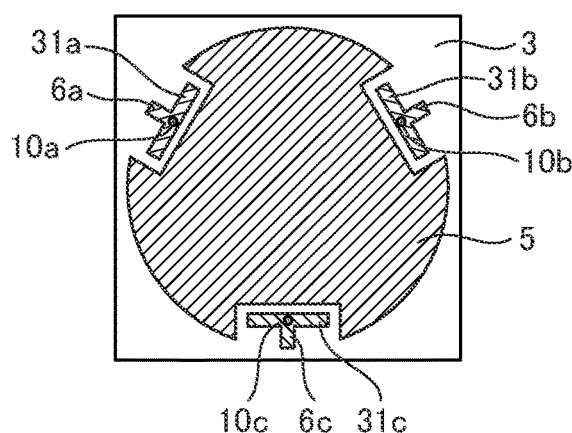
FIG. 14 is a bottom view showing the magnetic material 3 in the non-reciprocal circuit of FIG. 12.

In addition, FIG. 13 is a top view showing the magnetic material 3 in the non-reciprocal circuit of FIG. 12, and FIG. 14 is a bottom view showing the magnetic material 3 in the non-reciprocal circuit of FIG. 12.

Figure 15:
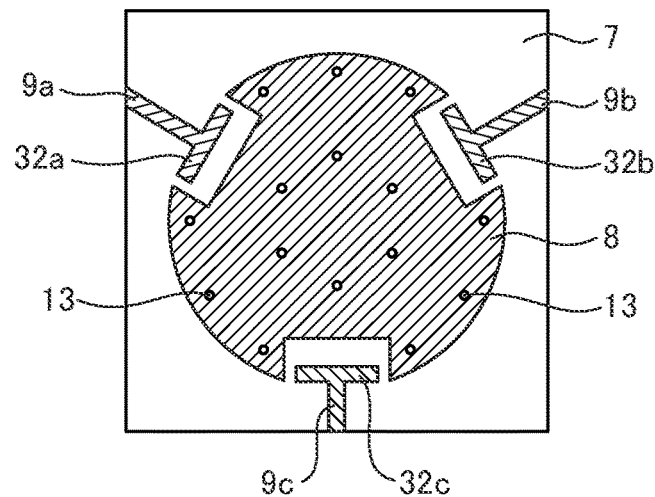
FIG. 15 is a top view showing the dielectric substrate 7 in the non-reciprocal circuit of FIG. 12.

In addition, FIG. 15 is a top view showing the dielectric substrate 7 in the non-reciprocal circuit of FIG. 12.

Incidentally, as for the cross-sectional structure of the non-reciprocal circuit of FIG. 12, it is the same as that of the non-reciprocal circuit of FIG. 1 (see FIG. 5).

In the present embodiment 4, the input/output terminal 6a is provided with a stub 31a, the input/output terminal 6b is provided with a stub 31b, and the input/output terminal 6c is provided with a stub 31c.

In addition, the signal conductor 9a is provided with a stub 32a, the signal conductor 9b is provided with a stub 32b, and the signal conductor 9c is provided with a stub 32c.

By providing the stubs 31a, 31b and 31c to the input/output terminals 6a, 6b and 6c and the stubs 32a, 32b and 32c to the signal conductors 9a, 9b and 9c, the present embodiment 4 can correct impedance mismatching, thereby being able to achieve better impedance connection.

Here, although both the input/output terminals 6a, 6b and 6c and the signal conductors 9a, 9b and 9c are provided with the stubs, if either the input/output terminals 6a, 6b and 6c or the signal conductors 9a, 9b and 9c are provided with the stubs, the impedance mismatching at the connecting portions can be corrected.

Incidentally, as for a connecting method between the input/output terminals and the signal conductors, and between the ground conductor 5 and the ground conductor 8, it is possible to employ a method of using the metal bumps as shown in the foregoing embodiment 1, or a method of using the adhesive with the conductive particles 22 dispersed therein as shown in the foregoing embodiment 3.

Here, although an example is shown in which the first connector is comprised of the through holes 10a, 10b and 10c which pass through the magnetic material 3 to electrically connect the center conductor 4 with the input/output terminals 6a, 6b and 6c, the present embodiment 4 can also connect the center conductor 4 with the input/output terminals 6a, 6b and 6c electrically through the capacitive coupling as in the foregoing embodiment 2.

Figure 16:
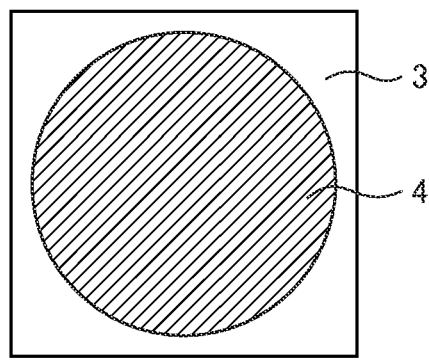
FIG. 16 is a top view showing the magnetic material 3 when the center conductor 4 is connected to the input/output terminals 6a, 6b and 6c through capacitive coupling.
Figure 17:
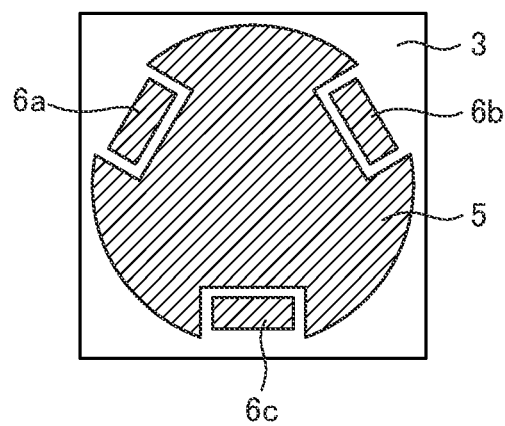
FIG. 17 is a bottom view showing the magnetic material 3 when the center conductor 4 is connected to the input/output terminals 6a, 6b and 6c through capacitive coupling.

FIG. 16 is a top view showing the magnetic material 3 when the center conductor 4 and the input/output terminals 6a, 6b and 6c are connected through the capacitive coupling; and FIG. 17 is a bottom view showing the magnetic material 3 when the center conductor 4 with the input/output terminals 6a, 6b and 6c are connected through the capacitive coupling.

Figure 18:
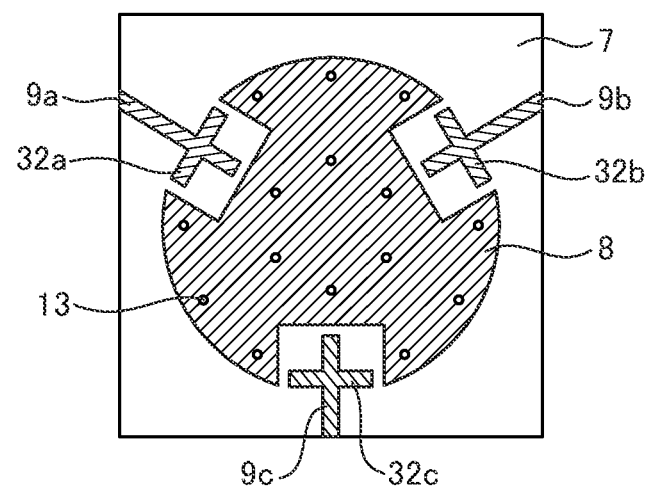
FIG. 18 is a top view showing the dielectric substrate 7 when the center conductor 4 is connected to the input/output terminals 6a, 6b and 6c through capacitive coupling.

In addition, FIG. 18 is a top view showing the dielectric substrate 7 when the center conductor 4 and the input/output terminals 6a, 6b and 6c are connected through the capacitive coupling.

Since connecting the center conductor 4 electrically with the input/output terminals 6a, 6b and 6c through the capacitive coupling can obviate the necessity of forming the through holes 10a, 10b and 10c in magnetic material 3, it can reduce the fabricating cost.

Embodiment 5

Figure 19:
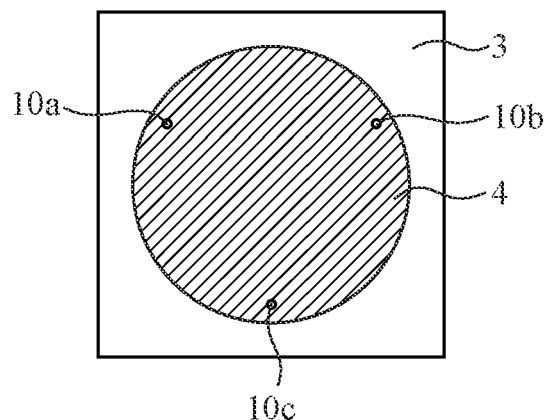
FIG. 19 is a top view showing the magnetic material 3 of a non-reciprocal circuit of an embodiment 5 in accordance with the present invention.
Figure 20:
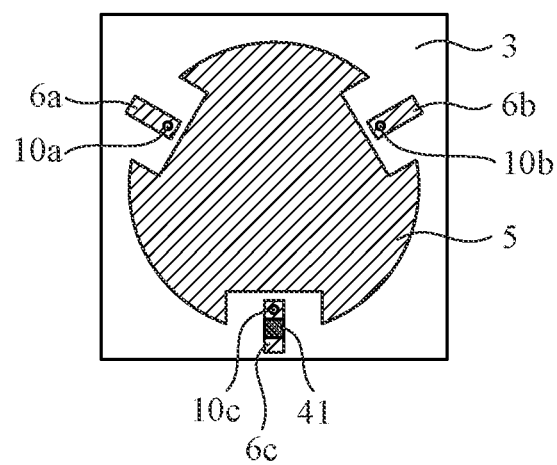
FIG. 20 is a bottom view showing the magnetic material 3 of the non-reciprocal circuit of the embodiment 5 in accordance with the present invention.

FIG. 19 is a top view showing the magnetic material 3 of a non-reciprocal circuit of an embodiment 5 in accordance with the present invention; and FIG. 20 is a bottom view showing the magnetic material 3 of the non-reciprocal circuit of the embodiment 5 in accordance with the present invention.

Figure 21:
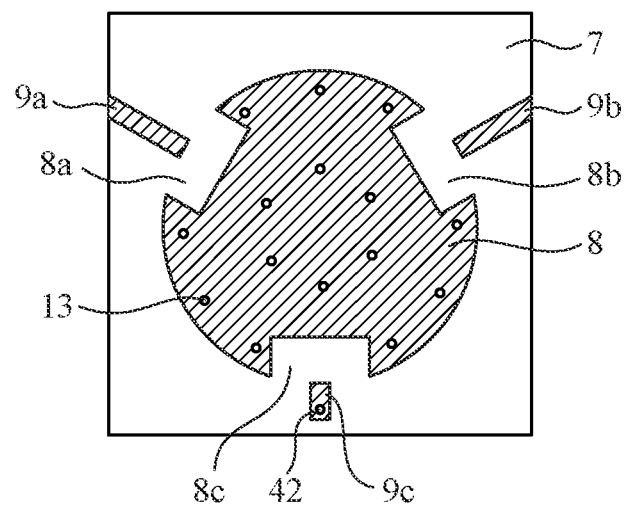
FIG. 21 is a top view showing the dielectric substrate 7 of the non-reciprocal circuit of the embodiment 5 in accordance with the present invention.
Figure 22:
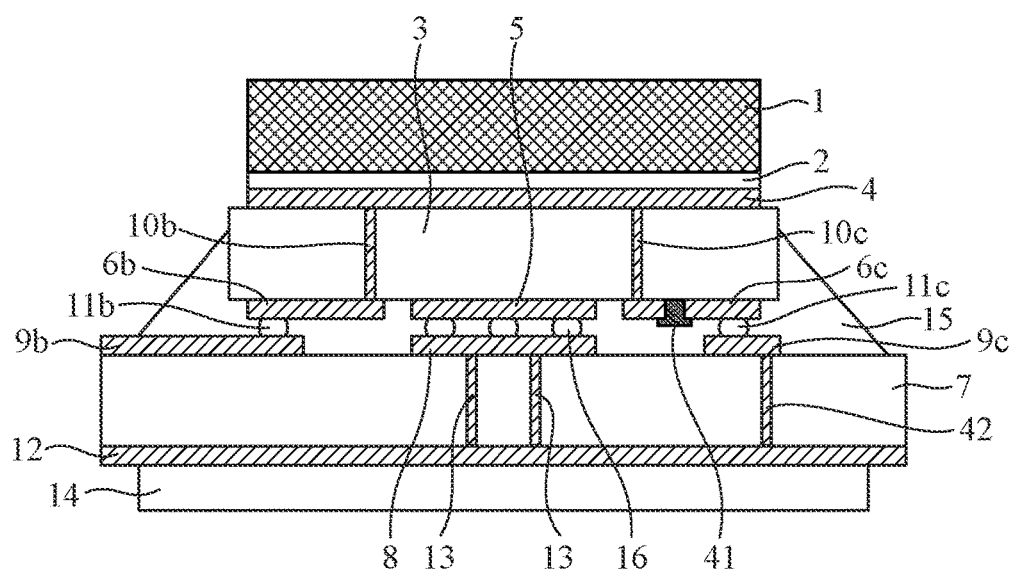
FIG. 22 is a cross-sectional view showing the non-reciprocal circuit of the embodiment 5 in accordance with the present invention.

In addition, FIG. 21 is a top view showing the dielectric substrate 7 of the non-reciprocal circuit of the embodiment 5 in accordance with the present invention; and FIG. 22 is a cross-sectional view showing the non-reciprocal circuit of the embodiment 5 in accordance with the present invention.

In FIG. 19 to FIG. 22, since the same reference symbols as those of FIG. 2 to FIG. 5 designate the same or like components, their description will be omitted. Only, in FIG. 22, the metal bump 11a, input/output terminal 6a and signal conductor 9a are not drawn.

In the present embodiment 5, a resistor 41 is connected in series with the input/output terminal 6c.

A through hole 42 is provided in such a manner as to pass through the dielectric substrate 7 so as to electrically connect the signal conductor 9c with the ground conductor 12.

Next, the operation will be described.

The planar magnetic material 3 is disposed under the permanent magnet 1 via the spacer 2 so as to be applied with the bias magnetic field by the permanent magnet 1.

As a result, a signal input via the input/output terminal 6a, 6b or 6c is affected by the bias magnetic field.

More specifically, the signal input to the input/output terminal 6a from the signal conductor 9a is transferred to the input/output terminal 6b almost without attenuation, and is output to the signal conductor 9b. In contrast, a greatly attenuated signal is transferred to the input/output terminal 6c so that the greatly attenuated signal is output from the signal conductor 9c.

As for the signal input to the input/output terminal 6b from the signal conductor 9b, unless the resistor 41 is connected to the input/output terminal 6c, it will be transferred to the input/output terminal 6c almost without attenuation so as to be output to the signal conductor 9c as in the foregoing embodiment 1. However, since the resistor 41 is connected to the input/output terminal 6c in the present embodiment 5, the resistor 41 greatly attenuates the signal. Thus, the greatly attenuated signal is output from the signal conductor 9c.

In addition, owing to the effect of the bias magnetic field, a greatly attenuated signal is transferred to the input/output terminal 6a as in the foregoing embodiment 1 so that the greatly attenuated signal is output from the signal conductor 9a.

Thus, the non-reciprocal circuit has characteristics of attenuating the signal in the transmission direction very slightly, but attenuating the signal in the reverse direction greatly.

As the foregoing embodiment 1, the present embodiment 5 is configured in such a manner that the input/output terminals 6a, 6b and 6c are formed within the portions of the cutouts 5a, 5b and 5c provided in the ground conductor 5 on the underside of the magnetic material 3; the signal conductors 9a, 9b and 9c are formed within the portions of the cutouts 8a, 8b and 8c of the ground conductor 8 on the top surface of the dielectric substrate 7, which cutouts 8a, 8b and 8c are provided at the same places as the cutouts 5a, 5b and 5c provided in the ground conductor 5; the through holes 10a, 10b and 10c electrically connect the center conductor 4 with the input/output terminals 6a, 6b and 6c; the metal bumps 11a, 11b and 11c electrically connect the input/output terminals 6a, 6b and 6c and the signal conductors 9a, 9b and 9c facing each other; and the metal bumps 16 electrically connect the ground conductor 5 to the ground conductor 8 (in FIG. 22, the metal bump 11a, input/output terminal 6a and signal conductor 9a are not drawn). Accordingly, the present embodiment 5 offers an advantage of being able to achieve stable reflection characteristics and to implement a small-sized, low-cost non-reciprocal circuit with less variation of the electrical characteristics.

Although the present embodiment 5 shows the circuit in which the first connector is comprised of the through holes 10a, 10b and 10c which pass through the magnetic material 3 to connect the center conductor 4 to the input/output terminals 6a, 6b and 6c electrically, a configuration is also possible which connects the center conductor 4 with the input/output terminals 6a, 6b and 6c electrically through the capacitive coupling as in the foregoing embodiment 2.

In addition, although the present embodiment 5 shows the circuit in which the second connector is comprised of the metal bumps 11a, 11b and 11c and the metal bumps 16, and the metal bumps 11a, 11b and 11c electrically connect the input/output terminals 6a, 6b and 6c and the signal conductors 9a, 9b and 9c facing each other (in FIG. 22, the metal bump 11a, the input/output terminal 6a and the signal conductor 9a are not drawn), a configuration is also possible which electrically connects the input/output terminals 6a, 6b and 6c and the signal conductors 9a, 9b and 9c facing each other through the insulating material 21 with the conductive particles 22 dispersed therein as in the present embodiment 3.

In addition, as in the foregoing embodiment 4, either the input/output terminals 6a, 6b and 6c or the signal conductors 9a, 9b and 9c can be provided with the stubs.

Incidentally, it is to be understood that a free combination of the individual embodiments, variations of any components of the individual embodiments or removal of any components of the individual embodiments is possible within the scope of the present invention.

INDUSTRIAL APPLICABILITY

A non-reciprocal circuit in accordance with the present invention is suitable for applications that must have stable reflection characteristics, and must provide a small-sized, low-cost circuit.

DESCRIPTION OF REFERENCE SYMBOLS 1 permanent magnet; 2 spacer; 3 magnetic material; 4 center conductor; 5 ground conductor (first ground conductor); 5a, 5b, 5c cutout; 6a, 6b, 6c input/output terminal; 7 dielectric substrate; 8 ground conductor (second ground conductor); 8a, 8b, 8c cutout; 9a, 9b, 9c signal conductor; 10a, 10b, 10c through hole (first connector); 11a, 11b, 11c metal bump (second connector); 12 ground conductor (third ground conductor); 13 through hole (third connector); 14 carrier; 15 insulating material; 16 metal bump (second connector); 21 insulating material (second connector); 22 conductive particles; 31a, 31b, 31c stub; 32a, 32b, 32c stub; 41 resistor; 42 through hole.

What is claimed is:

1. A non-reciprocal circuit comprising:
   a planar magnetic material;
   a center conductor formed on a top surface of the magnetic material;
   a first ground conductor formed on the underside of the magnetic material, and having a plurality of cutouts provided around its periphery;
   a plurality of input/output terminals formed within portions of the cutouts provided in the first ground conductor on the underside of the magnetic material;
   a dielectric substrate disposed face to face with the underside of the magnetic material;
   a second ground conductor formed on a top surface of the dielectric substrate, and having a plurality of cutouts provided in the same places as the cutouts provided in the first ground conductor;
   a plurality of signal conductors formed within portions of the cutouts provided in the second ground conductor on the top surface of the dielectric substrate;
   a first connector to electrically connect the center conductor to the plurality of input/output terminals;
   a second connector to electrically connect the input/output terminals and the signal conductors facing each other among the plurality of input/output terminals and the plurality of signal conductors, and to electrically connect the first ground conductor with the second ground conductor; and
   a permanent magnet disposed face to face with the top surface of the magnetic material on which the center conductor is formed.

2. The non-reciprocal circuit according to claim 1, wherein
   the first connector is comprised of through holes passing through the magnetic material.

3. The non-reciprocal circuit according to claim 1, wherein
   the first connector electrically connects the center conductor to each of the plurality of input/output terminals by capacitive coupling.

4. The non-reciprocal circuit according to claim 1, wherein
   the second connector is comprised of metal bumps.

5. The non-reciprocal circuit according to claim 1, wherein
   the second connector is comprised of an insulating material in which conductive particles are dispersed.

6. The non-reciprocal circuit according to claim 1, further comprising:
   a carrier disposed face to face with an underside of the dielectric substrate.

7. The non-reciprocal circuit according to claim 1, further comprising:
   a third ground conductor that is formed on the underside of the dielectric substrate and is electrically connected with the second ground conductor.

8. The non-reciprocal circuit according to claim 1, wherein
   at least either the plurality of input/output terminals or the plurality of signal conductors comprise a stub.

9. The non-reciprocal circuit according to claim 1, further comprising:
   a resistor connected in series with one of the plurality of input/output terminals.

10. A non-reciprocal circuit comprising:
    a planar magnetic material;
    a center conductor formed on a top surface of the magnetic material;
    a first ground conductor formed on the underside of the magnetic material, and having a plurality of cutouts provided around its periphery;
    a plurality of input/output terminals formed within portions of the cutouts provided in the first ground conductor on the underside of the magnetic material;
    a dielectric substrate disposed face to face with the underside of the magnetic material;
    a second ground conductor formed on a top surface of the dielectric substrate, and having a plurality of cutouts provided in the same places as the cutouts provided in the first ground conductor;
    a plurality of signal conductors formed within portions of the cutouts provided in the second ground conductor on the top surface of the dielectric substrate;
    a first connector to electrically connect the center conductor to the plurality of input/output terminals;
    a second connector to electrically connect the input/output terminals and the signal conductors facing each other among the plurality of input/output terminals and the plurality of signal conductors, and to electrically connect the first ground conductor with the second ground conductor; and
    a permanent magnet disposed face to face with the underside of the dielectric substrate.

11. The non-reciprocal circuit according to claim 10, wherein
    the first connector is comprised of through holes passing through the magnetic material.

12. The non-reciprocal circuit according to claim 10, wherein
    the first connector electrically connects the center conductor to each of the plurality of input/output terminals by capacitive coupling.

13. The non-reciprocal circuit according to claim 10, wherein
    the second connector is comprised of metal bumps.

14. The non-reciprocal circuit according to claim 10, wherein
    the second connector is comprised of an insulating material in which conductive particles are dispersed.

15. The non-reciprocal circuit according to claim 10, further comprising:
    a carrier disposed face to face with an underside of the dielectric substrate.

16. The non-reciprocal circuit according to claim 10, further comprising:
    a third ground conductor that is formed on the underside of the dielectric substrate and is electrically connected with the second ground conductor.

17. The non-reciprocal circuit according to claim 10, wherein
    at least either the plurality of input/output terminals or the plurality of signal conductors comprise a stub.

18. The non-reciprocal circuit according to claim 10, further comprising:
    a resistor connected in series with one of the plurality of input/output terminals.

* * * * *